United States Patent
Aoki et al.

(10) Patent No.: US 8,773,009 B2
(45) Date of Patent: Jul. 8, 2014

(54) ILLUMINATION APPARATUS TO REDUCE INSECT ATTRACTANCY

(71) Applicant: Panasonic Corporation, Osaka (JP)

(72) Inventors: Shinichi Aoki, Osaka (JP); Makoto Yamada, Osaka (JP); Masaki Ishiwata, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/718,020

(22) Filed: Dec. 18, 2012

(65) Prior Publication Data

US 2013/0169146 A1 Jul. 4, 2013

(30) Foreign Application Priority Data

Dec. 19, 2011 (JP) .................. 2011-277230

(51) Int. Cl.
*H05B 33/22* (2006.01)
(52) U.S. Cl.
USPC .............. 313/498; 313/485; 313/487; 257/40
(58) Field of Classification Search
USPC ............ 362/84, 231; 313/501, 483–487, 489; 257/40, 98
See application file for complete search history.

(56) References Cited

U.S. PATENT DOCUMENTS

| | | | | |
|---|---|---|---|---|
| 7,959,312 | B2 * | 6/2011 | Yoo et al. .................. | 362/84 |
| 2007/0205711 | A1 * | 9/2007 | Takashima et al. .......... | 313/502 |
| 2008/0284316 | A1 | 11/2008 | Kurihara et al. | |
| 2011/0031894 | A1 * | 2/2011 | Van De Ven ................. | 315/294 |
| 2011/0279998 | A1 | 11/2011 | Su et al. | |
| 2012/0306356 | A1 * | 12/2012 | Yoon et al. .................... | 313/503 |
| 2013/0241391 | A1 * | 9/2013 | Takei ............................ | 313/498 |

FOREIGN PATENT DOCUMENTS

| | | |
|---|---|---|
| EP | 1 630 877 | 3/2006 |
| EP | 1 830 418 | 9/2007 |
| JP | 2001-028947 | 2/2001 |
| JP | 2005-019336 | 1/2005 |
| JP | 2008-154541 | 7/2008 |
| JP | 2009-224148 | 10/2009 |
| JP | 4396389 | 10/2009 |
| JP | 2009-261267 | 11/2009 |
| WO | 2010/023624 | 3/2010 |
| WO | 2011/105157 | 9/2011 |

OTHER PUBLICATIONS

Osamo Kuramitsu et al, "Lighting Instrument with Reduced Insect Attractiveness Maintaining Color Rendering Property", Matsushita Electric Works technical report (vol. 53 No. 1) (date unknown).
Extended European Search Report for corresponding European Application No. 12008420.7 dated May 6, 2013.

* cited by examiner

*Primary Examiner* — Tracie Y Green
(74) *Attorney, Agent, or Firm* — Renner, Otto, Boisselle & Sklar, LLP

(57) ABSTRACT

An illumination apparatus includes an LED light source including one or more LEDs. A spectrum of lights emitted from the LED light source has a first peak wavelength in a wavelength band ranging from 380 nm to 470 nm and a second peak wavelength in a wavelength band ranging from 500 nm to 700 nm, and a half width of the first peak wavelength is set to be equal to or less than 20 nm.

10 Claims, 9 Drawing Sheets

L(100nm)/
H(398nm)/
L(244nm)/
H(398nm)/
L(244nm)/
H(398nm)/
L(244nm)/
H(398nm)/

ILLUMINATION APPARATUS TO REDUCE INSECT ATTRACTANCY

FIELD OF THE INVENTION

The present invention relates to an illumination apparatus including an LED light source that hardly attracts insects.

BACKGROUND OF THE INVENTION

Typically, insects are attracted to a light irradiated from a lighting fixture, which makes people displeased. It is known that a light which easily attracts insects is a short wavelength light with a peak wavelength in the ultraviolet. FIG. 14 shows a correlation between a wavelength of lights and an insect attractancy (see, Matsushita Electric Works technical report Vol. 53 No. 1 (MEW technical report)). In FIG. 14, "cutoff wavelength" indicates that lights having wavelengths shorter than a predetermined wavelength are cut off by a filter. Further, with reference to the case where no filter is provided, an insect attraction ratio rapidly decreases as the cutoff wavelength of lights approaches 410 nm, and the insect attraction ratio becomes almost zero at about 600 nm. In other words, by cutting off short wavelength lights including ultraviolet lights, the insect attraction ratio can be reduced.

As shown in FIG. 14, in a case where a cutoff wavelength is set to 380 nm (case 1), due to the presence of the insects that are attracted to lights in a visible region, it cannot be stated that the insect attractancy is sufficiently low. Further, in a case where the cutoff wavelength is set to 450 nm (case 2), the insect attractancy is improved. Since, however, the lights are cut off at a visible region near 450 nm, the illumination light becomes yellow, which is not suitable for use as general lighting. Furthermore, in a case where a cutoff wavelength is set to 600 nm (case 3), insects are almost not attracted to the illumination light, but the illumination light is seen as red and, thus, in reality, cannot be used as general lighting.

Meanwhile, in the illumination apparatus including an LED as a light source, by appropriately selecting LED chips or fluorescent materials, it is possible to reduce ultraviolet emissions in the output lights, and thus, when compared to fluorescent lamps and the like, the insect attractancy can be lowered. However, because there are many insects that are attracted to the visible lights emitted from the LED, it cannot be stated that the insect attractancy is sufficiently low.

In such an illumination apparatus, lights from a white LED using a first LED emitting blue lights and a yellow fluorescent material, are mixed with lights from a second LED lights with a peak wavelength of 500 nm or more, so that the insect attractancy is lowered (see, e.g., Japanese Patent Application Publication No. 2009-224148).

However, in the illumination apparatus described in the above-cited reference, in a case where the second LED lights have a peak wavelength of 500 nm or more in red light, due to the visual inability of many insects to recognize red light, it cannot be expected that the red lights repel insects. In addition, in a case where the second LED lights have a peak wavelength in yellow light, the yellow lights have a behavior inhibiting effect on nocturnal lepidopteran insects (e.g., moths). However, it is unconfirmed that this effect applies to other insects, and therefore, the effect is limited to nocturnal lepidopteran insects.

SUMMARY OF THE INVENTION

In view of the above, the present invention provides an illumination apparatus including an LED light source, capable of reducing insect attractancy.

In accordance with an aspect of the present invention, there is provided an illumination apparatus including an LED light source having one or more LEDs, wherein a spectrum of lights emitted from the LED light source has a first peak wavelength in a wavelength band ranging from 380 nm to 470 nm and a second peak wavelength in a wavelength band ranging from 500 nm to 700 nm, and a half width of the first peak wavelength is set to be equal to or less than 20 nm.

The spectrum may include a bottom wavelength lying between the first peak wavelength and the second peak wavelength, and a ratio of a relative energy strength of the bottom wavelength to a larger relative energy strength of the first and second peak wavelengths may be equal to or less than $1/10$.

In the spectrum, the relative energy strength of the first peak wavelength may be greater than that of the second peak wavelength.

In the spectrum, the relative energy strength of the second peak wavelength may be greater than that of the first peak wavelength.

In the spectrum, the relative energy strength in a wavelength band ranging from 380 nm or less may be substantially zero.

In accordance with the aspect of the present invention, the half width of the first peak wavelength lying in the wavelength band ranging from 380 nm to 470 nm is set to be equal to or less than 20 nm, so that ultraviolet lights and near ultraviolet lights, which lay in the short wavelength side of the first peak wavelength and are likely to attract insects, are hardly included in the emitted lights of the LED 4, resulting in low insect attractancy.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

An illumination apparatus in accordance with a first embodiment of the present invention will be now described with reference to FIGS. 1A to 4.

Figure 1A:
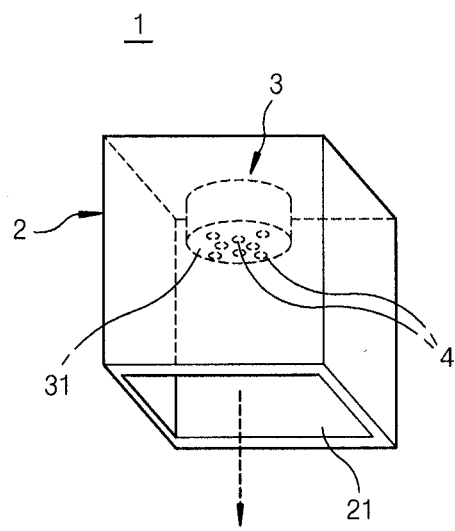
FIGS. 1A and 1B are a perspective view showing a configuration of an illumination apparatus in accordance with a first embodiment of the present invention, and a front view of the illumination apparatus when viewed from its light emission side, respectively.
Figure 1B:
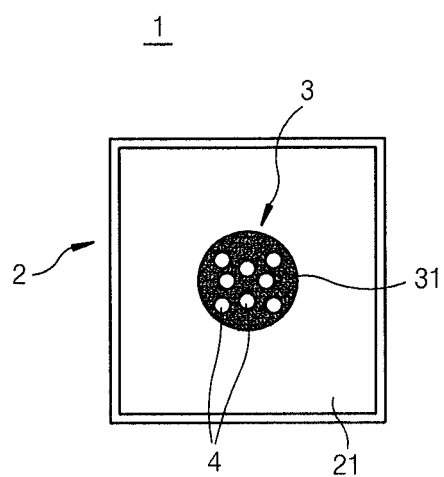
Figure 2:
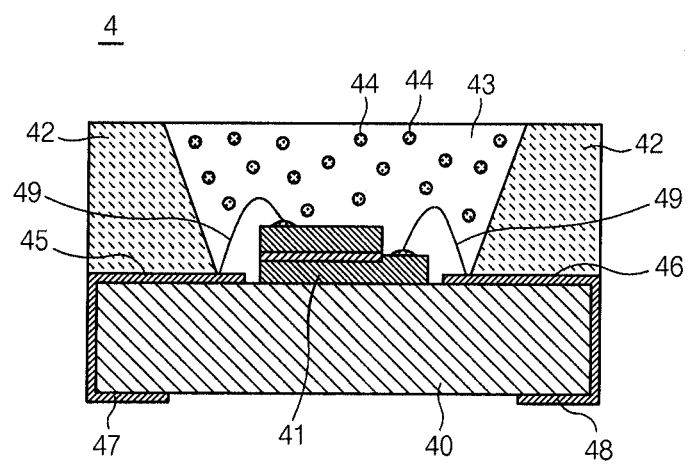
FIG. 2 is a side sectional view of an LED used in the illumination apparatus.

As shown in FIGS. 1A and 1B, an illumination apparatus 1 includes a housing body 2 having one side formed with an opening 21; and an LED light source 3 accommodated in the housing body 2. The LED light source 3 includes a plurality of LEDs 4 and a substrate 31 on which the LEDs 4 are mounted, and is attached to a side of the housing body 2, opposite to the opening 21. The illumination apparatus 1 is used as a lighting fixture directly attached to, for example, a ceiling by means of a mounting jig (not shown) or as a down light buried in a ceiling.

Figure 4:
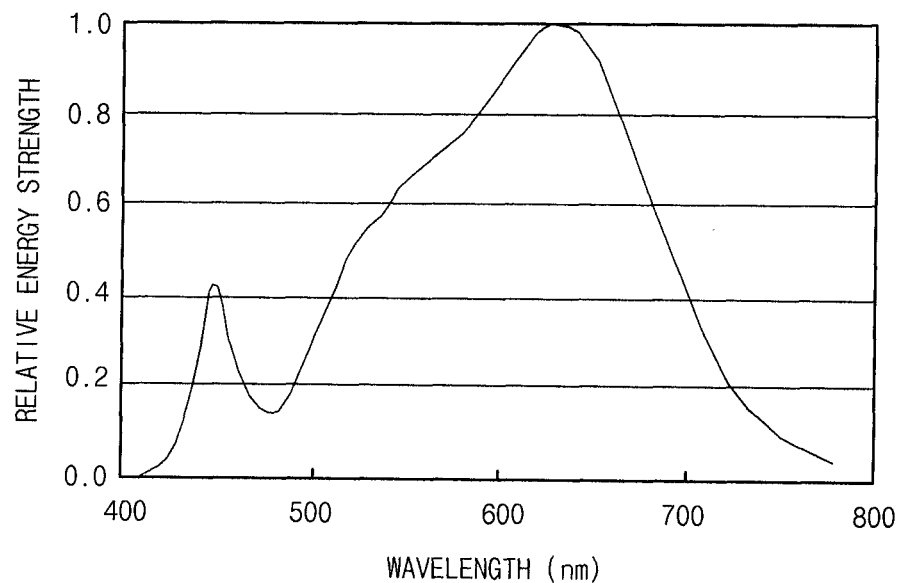
FIG. 4 shows a spectrum of lights emitted from an illumination apparatus in accordance with a modification of the first embodiment (Test Example 2)

As shown in FIG. 4, each of the LEDs 4 includes a base material 40 having a rectangular section; a light emitting part 41 (LED chip) mounted on the base material 40; a frame having a concave portion formed in such a way as to surround the LED chip 41; and a seal member 43 filled in the frame 42. The seal member 43 is made of a silicone resin or the like and contains fluorescent materials 44 serving to change a wavelength of lights emitted from the LED chip 41. The base material 40 has one side provided with a cathode electrode 45 and the other side provided with an anode electrode 46 in the form of a lead frame, both of which are respectively connected to external connection electrodes 47 and 48 respectively formed in opposite ends in the bottom of the base material 40.

The cathode electrode 45 and the anode electrode 46 are also respectively connected to electrode terminals (not shown) of the LED chip 41 via wires 49. The inner peripheral surface of the frame 42 is formed as a conical surface opened in a light emitting direction, with its surface having a light reflection function. The LED chip 41 employs, for example, a blue LED element which emits blue lights, and an LED 4 which emits lights having a desired color can be obtained by controlling the type or content of the fluorescent materials 44.

In this embodiment, the LED chip 41 emits lights having a peak wavelength in a wavelength band ranging from blue-violet (380 nm) to blue (470 nm), the peak wavelength being here referred to as a "first peak wavelength." The fluorescent materials 44 change the wavelength of lights emitted from the LED chip 41, thereby emitting lights having a second peak wavelength in a wavelength band ranging from 500 nm to 700 nm.

The substrate 31, which may be a print substrate, a ceramics substrate or the like, includes wiring circuits (not shown) formed in a surface thereof on which the LED 4 is to be mounted, the wiring circuits being respectively connected to the cathode electrode 45 and the anode electrode 46 of the LED 4 via the external connection electrodes 47 and 48. The substrate 31 is not limited to the disk shape as shown, but may have a polygon shape or the like.

The LED chip 41 employs a blue-violet LED element having a peak wavelength in a wavelength band ranging from blue-violet (380 nm) to blue (470 nm), such as an InGaN blue LED (available from, for example, Nichia Chemicals, Toyota LED Synthetics, Epistar, Mitsubishi Chemicals, etc.). The LED chip 41 employing the blue-violet LED excites the fluorescent materials 44 with high efficiency.

The fluorescent materials 44 may be wavelength conversion materials with excellent conversion efficiency, such as YAG (Yttrium-Aluminum-Garnet) fluorescent materials, silicate fluorescent materials or the like. In addition, the fluorescent materials 44 are configured such that a distribution spectrum of wavelength-converted lights has a desired characteristic by selection of wavelength conversion materials, setting of a mixture ratio of the wavelength conversion materials to the seal member 43, mixture or combination of different wavelength conversion materials, and the like. In this embodiment, the fluorescent materials 44 formed of one or more kinds of wave length conversion materials makes a pair with the LED chip 41, so that the distribution spectrum of wavelength-converted lights has target peak and bottom wavelengths.

For example, the fluorescent materials 44 may be yellow fluorescent materials for absorbing some of lights emitted from the LED chip 41 and converting them to lights of a long wavelength band including yellow lights. In this case, the LED 4 is configured such that the distribution spectrum of wavelength-converted light has a first peak wavelength in the wavelength band ranging from 400 nm to 470 nm and the second peak wavelength in the wavelength band ranging from 500 nm to 700 nm, and the half value-width of the first peak wavelength is set to be equal to or less than 20 nm.

In addition, in this embodiment, the fluorescent materials 44 are configured such that the relative energy strength of the first peak wavelength becomes greater than that of the second peak wavelength by controlling the kind and concentration of the fluorescent materials 44. By using an appropriate kind and concentration of the fluorescent materials 44, it is possible to allow the LED 4 to emit white lights or bulb color lights even when the peak wavelength of lights from the LED chip 41 is any wavelength ranging from the blue-violet wavelength band to the blue wavelength band.

Figure 3:
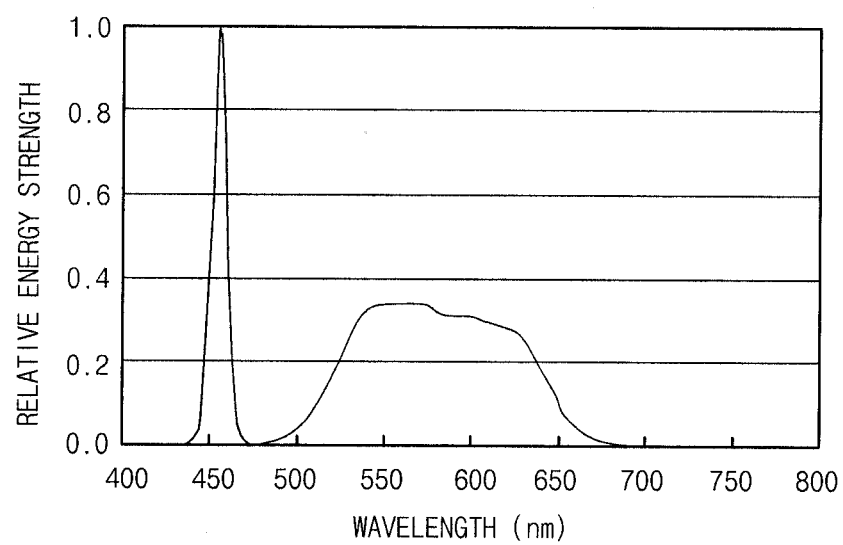
FIG. 3 shows a spectrum of lights emitted from the illumination apparatus (Test Example 1)

FIG. 3 shows a relative spectrum of lights emitted from the LED 4 employing the LED chip 41 in which the peak wavelength of emitted lights ranges from the blue-violet wavelength band to the blue wavelength band and using yellow silicate fluorescent materials as the fluorescent materials 44. The spectrum is normalized by putting the first peak wavelength in the wavelength band ranging from 400 nm to 470 nm, putting the second peak wavelength in the wavelength band ranging from 500 nm to 700 nm, and setting the relative energy strength of the first peak wavelength to 1. In addition, the spectrum is configured by setting the half width of the first peak wavelength to be equal to or less than 20 nm. In the meantime, the second peak wavelength has a wide range of wavelength distribution ranging from 500 nm to 700 nm.

In accordance with the present embodiment, since the half width of the first peak wavelength lying in the wavelength band ranging from 400 nm to 470 nm is set to be equal to or less than 20 nm, ultraviolet lights and near ultraviolet lights, which lie in the short wavelength side with respect to the first peak wavelength and are likely to attract insects, are hardly included in the emitted lights of the LED 4, resulting in low insect attractancy. In addition, the LED 4 is configured such that the relative energy strength of the first peak wavelength is greater than that of the second peak wavelength. That is, when one or more fluorescent materials excited by lights having the first peak wavelength are used to emit lights having frequencies near the second peak wavelength, a spectrum of the mixed lights shows the peak of the low wavelength side becomes relatively high. Accordingly, it is possible to obtain an illumination apparatus 1 which emits white lights having a high color temperature.

FIG. 4 shows a spectroscopy of lights emitted from an illumination apparatus in accordance with a modification of the first embodiment. This illumination apparatus has the same configuration as the first embodiment except that two kinds of YAG and silicate yellow fluorescent materials are used as the fluorescent materials 44 and their concentrations are higher than that of the first embodiment. Here, blue lights emitted from the LED chip 41 are wavelength-converted into yellow lights with a high probability by the fluorescent materials 44.

In this modification, the LED 4 is configured such that the relative energy strength of the second peak wavelength is greater than that of the first peak wavelength. Accordingly, the spectrum of the mixed lights of the first and second peak wavelengths shows that the peak of the high wavelength side becomes relatively high, thereby obtaining an illumination apparatus 1 which emits bulb color lights having a low color temperature. In addition, since the half width of the first peak wavelength is set to be equal to or less than 20 nm as well, ultraviolet lights and near ultraviolet lights, which are likely to attract insects, are hardly included in the emitted lights, resulting in low insect attractancy.

As an alternative, an ultraviolet emitting device emitting ultraviolet lights (having a wavelength band ranging from 200 nm to 380 nm) may be used for the LED chip 41, and the ultraviolet lights can be converted into visible lights by controlling the kinds and/or the amount of the employed fluorescent materials 44 in order to obtain the same spectrum as those described above. In this case, for example, an InGaN ultraviolet LED chip (available from, for example, Nichia Chemicals, Seoul Electronics, Nitride Semiconductors, etc.) or the like may be used for the ultraviolet emitting device.

In recent years, illumination apparatuses using LEDs have spread as substitutes for incandescent lamps, fluorescent lamps and so on. In general, an illumination apparatus (or lighting fixture) includes a white light type favored for working areas, studies and the like, and a bulb color light type favored for living rooms, bedrooms and the like. In accordance with the illumination apparatus 1 of the present embodiment, it is possible to reduce the insect attractancy for both of white light type and bulb color type LED light sources by setting the half width of the above-described first peak wavelength to be equal to or less than 20 nm.

Figure 5:
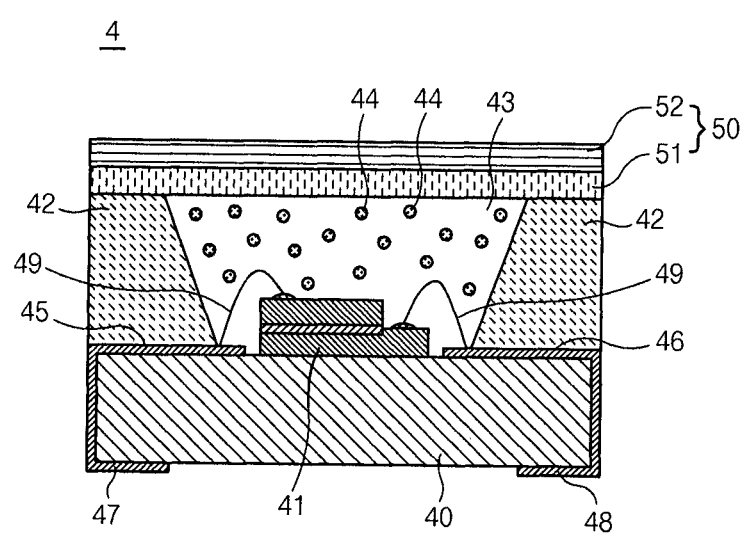
FIG. 5 is a side sectional view showing an LED used in an illumination apparatus in accordance with a second embodiment of the present invention.

Next, an illumination apparatus in accordance with a second embodiment of the present invention will be described with reference to FIGS. 5 to 8. As shown in FIG. 5, an LED 4 used for the illumination apparatus of this embodiment further includes a wavelength cutoff filter 5 which is provided at a side of the seal member 43 to which the lights are emitted in order to suppress transmission of lights having a predetermined wavelength.

Figure 6A:
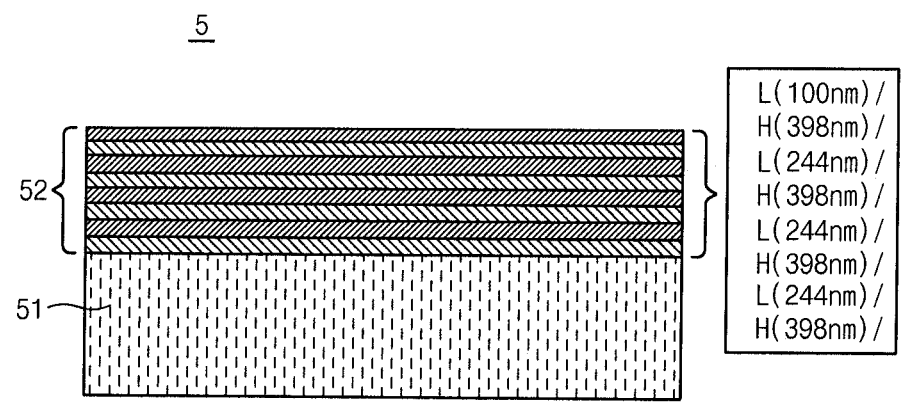
FIGS. 6A and 6B are an enlarged side view of a wavelength cutoff filter used in the illumination apparatus and a graph showing an example of transmissivity of the wavelength cutoff filter, respectively.

As shown in FIG. 6A, the wavelength cutoff filter 5 includes a light-transmitting substrate 51 made of glass, acryl resin or the like; and an optical multi-layered film 52 formed on the light-transmitting substrate 51, the optical multi-layered film 52 being formed by stacking high refractive index layers H made of a light-transmitting material having a relatively high refractive index and low refractive index layers L made of a light-transmitting material having a relatively low refractive index in an alternating fashion. The wavelength cutoff filter 5 serves to allow the emitted lights from the LED 4 to have desired spectrum characteristics and adjust a ratio of a relative energy strength of the bottom wavelength to a larger relative energy strength of the first and second peak wavelengths to 1/10 or less.

The optical multi-layered film 52 is formed by alternately stacking, on the light-transmitting substrate 51 made of, e.g., glass, four high refractive index layers H, each of which is made of titanium oxide and has a layer thickness of 400 nm and three low refractive index layers L, each of which is made of silicon oxide and has a layer thickness of 246 nm, and finally stacking one 100 nm-thick low refractive index layer L thereon. The optical multi-layered film 52 causes lights to be interfered at interfaces between layers having different refractive indexes, and lights having a predetermined wavelength are suppressed from being transmitted by adjusting the thickness of each of the layers depending on wavelengths of the interfered lights.

Figure 6B:
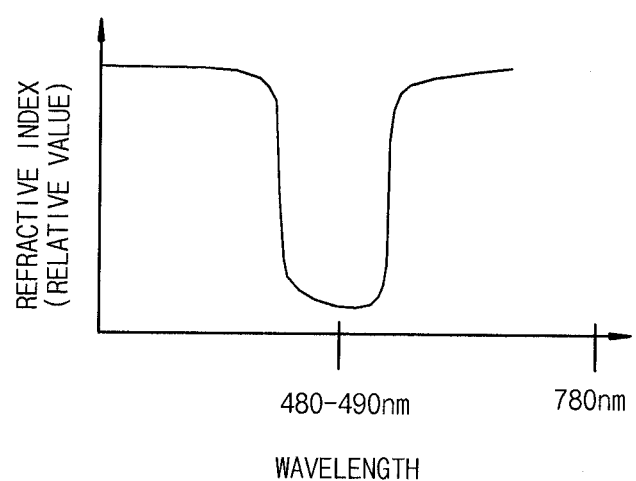

Composition, thickness and layer configuration of such dielectric thin films in the optical multi-layered film 52 are designed through a simulation using, for example, film design software, and the dielectric thin films are formed by electron beam evaporation or the like. In this embodiment, the use of the above-configured optical multi-layered film allows the wavelength cutoff filter 5 to suppress transmission of lights having at least a wavelength range of 480 nm to 490 nm, as shown in FIG. 6B.

Figure 7:
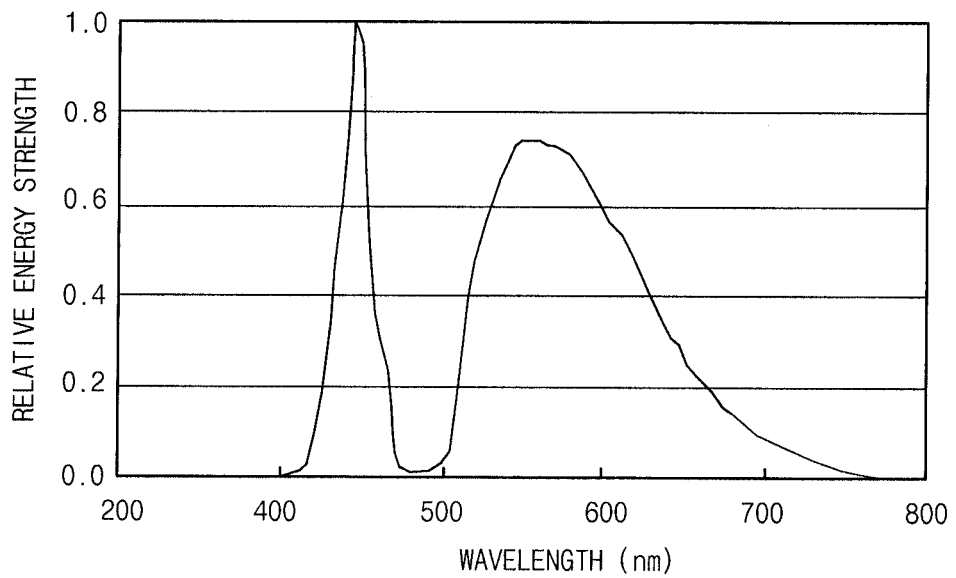
FIG. 7 shows a spectrum of lights emitted from the illumination apparatus of the second embodiment (Test Example 3)

FIG. 7 shows a relative spectrum of lights emitted from the LED 4 which employs the LED chip 41 in which the peak wavelength of emitted lights ranges from the blue-violet wavelength band to the blue wavelength band and the wavelength cutoff filter 5 having the above-described 8-layer optical multi-layered film 52 and uses yellow silicate fluorescent materials as the fluorescent materials 44. This spectrum has a bottom wavelength having a low relative energy strength in a wavelength band ranging from at least 470 nm to 500 nm, a ratio of a relative energy strength of the bottom wavelength to a relative energy strength of the first peak wavelength being set to 1/10 or less. In addition, this spectrum has the first peak wavelength in a wavelength band ranging from 400 nm to 470 nm and the second peak wavelength in a wavelength band ranging from 610 nm to 630 nm.

In accordance with the present embodiment, since the above-mentioned bottom wavelength lies between the first and second peak wavelengths in the spectrum of emitted lights, it is possible to reduce the insect attractancy by restricting some of lights in a visible region which are likely to attract insects. In addition, the bottom wavelength is located in the middle between the blue wavelength region and the yellow wavelength region. This results in a small effect on the relative energy strength of the blue lights and the yellow lights and no effect on the light color of white lights which can be obtained by the mixed lights, thereby realizing a desired tone.

Figure 8:
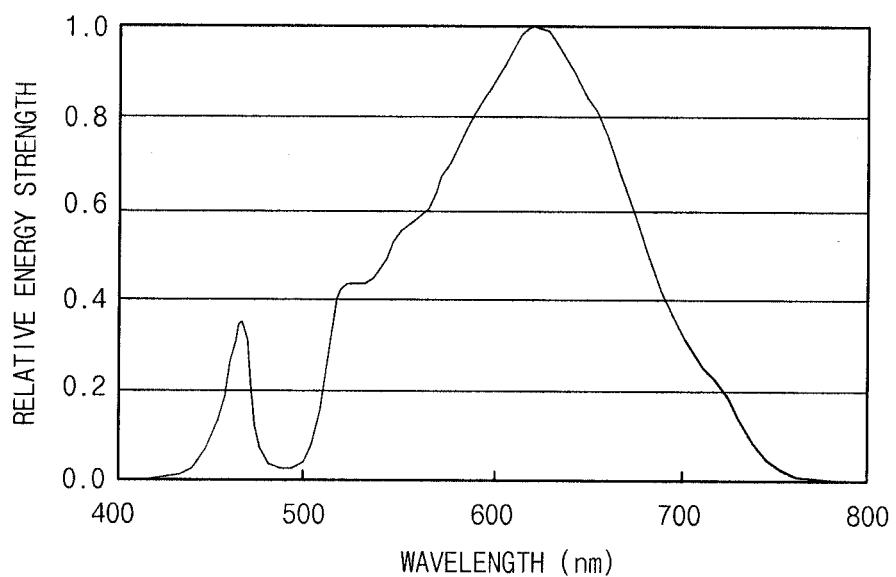
FIG. 8 shows a spectrum of lights emitted from an illumination apparatus in accordance with a modification of the second embodiment (Test Example 4)

FIG. 8 shows a spectroscopy of lights emitted from an illumination apparatus in accordance with a modification of the second embodiment. Like the modification of the first embodiment, in this illumination apparatus, the LED 4 uses two kinds of yellow YAG and silicate fluorescent materials as the fluorescent materials 44 and is provided with the wavelength cutoff filter 5 having the above-described 8-layer optical multi-layered film 52. Other configurations are the same as the above-described embodiment.

In the present modification, since the LED 4 is configured such that the relative energy strength of the second peak wavelength is greater than that of the first peak wavelength, it is possible to obtain an illumination apparatus 1 which emits bulb color lights. In addition, since the half width of the first peak wavelength is set to be equal to or less than 20 nm as well, ultraviolet lights and near ultraviolet lights, which are likely to attract insects, are hardly included in the emitted light, resulting in low insect attractancy.

In other words, by setting a ratio of a relative energy strength of the bottom wavelength between the first and second peak wavelengths to a larger relative energy strength of the first and second peak wavelengths to 1/10 or less, it is possible to suppress emission of lights in a visible region which are likely to attract insects. In addition, since this bottom wavelength has no effect on any of the first and second peak wavelengths, it is possible to provide lower insect attractancy in both of the white light type having a high relative energy strength of the first peak wavelength and the bulb color light type having a high relative energy strength of the second peak wavelength, without having an effect on their tones.

Figure 9:
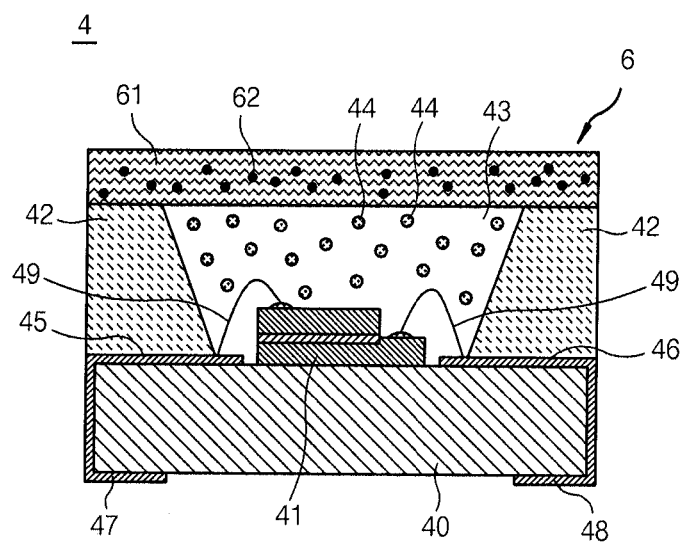
FIG. 9 is a side sectional view showing an LED used in an illumination apparatus in accordance with a third embodiment of the present invention.

Next, an illumination apparatus in accordance with a third embodiment of the present invention will be described with reference to FIGS. 9 and 10. As shown in FIG. 9, the illumination apparatus of this embodiment further includes an ultraviolet filter 6 which is provided at a side of the seal member 43 to which the lights are emitted in order to suppress transmission of lights in a wavelength band ranging from 380 nm or less. The ultraviolet filter 6 is formed by adding an additive 62 such as an ultraviolet absorbent (for example, Tinuvin 326 (available from Ciba Company) to a light-transmitting resin material 61. An example of the light-transmitting resin material 61 may include acryl resin (PMMA) and polycarbonate resin (PC). An example of the additive 62 may include dye and pigment but it is preferable to employ an ultraviolet absorbent in view of light-transmission, tone and durability of the ultraviolet filter 6.

Figure 10:
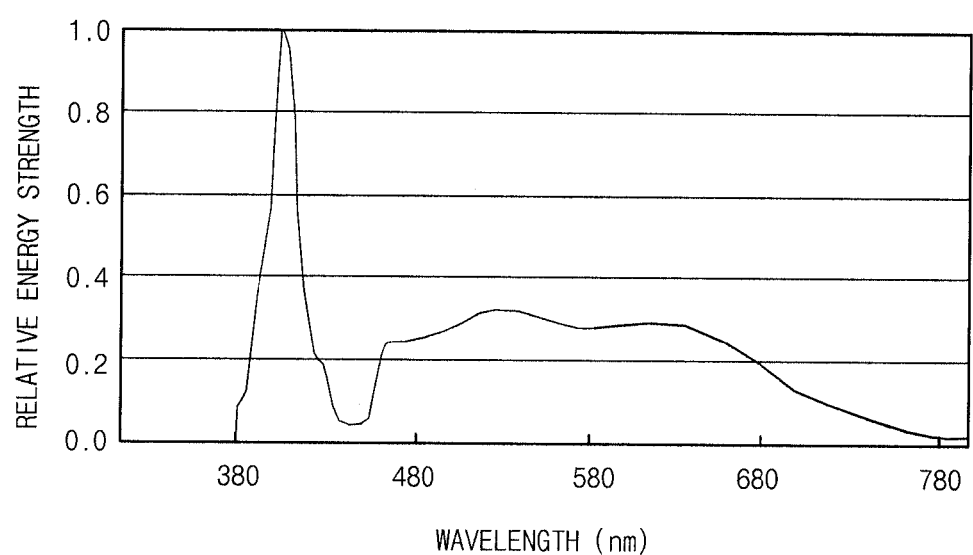
FIG. 10 shows a spectrum of lights emitted from the illumination apparatus of the third embodiment (Test Example 5)

FIG. 10 shows a relative spectrum of lights emitted from the LED 4, including the ultraviolet filter 6, which employs the LED chip 41 in which the peak wavelength of emitted light lies in a violet wavelength band and uses yellow silicate fluorescent materials as the fluorescent materials 44. This spectrum has the first peak wavelength in a wavelength band ranging from 380 nm to 450 nm and the second peak wavelength in a broad wavelength band ranging from 500 nm to 700 nm, the relative energy strength of a wavelength band of 380 nm or less is substantially zero.

In this embodiment, since the LED chip 41 is a chip having a peak wavelength in a lower wavelength side than those of the chips used in the first and second embodiments, the emitted lights of the LED chip 41 may include lights having a wavelength band of 380 nm or less which provides high insect attractancy. However, since the lights having the wavelength band of 380 nm or less are cut off by the ultraviolet filter 6, the lights emitted from the LED 4 does not include the lights having such a high insect attractancy wavelength band, resulting in low insect attractancy.

The ultraviolet filter 6 is not limited to the above configuration but may be a filter which is formed by stacking an optical multi-layered film on a glass substrate and cuts off lights of short wavelengths of 380 nm or less. Alternatively, it may be configured to obtain the above-described optical transmission characteristics by means of a light-transmitting glass made of, for example, borosilicate or phosphate or the like added with a halide or the like.

Figure 11A:
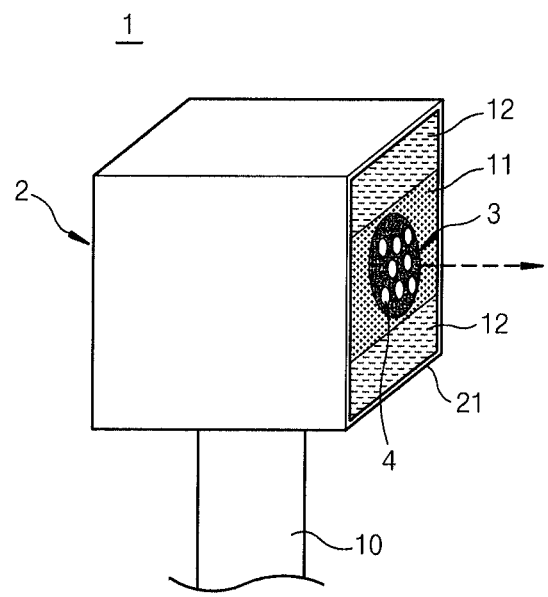
FIGS. 11A and 11B are a perspective view of an illumination apparatus used for measuring the insect attractancy and a front view of the illumination apparatus when viewed from a light emission side, respectively.
Figure 11B:
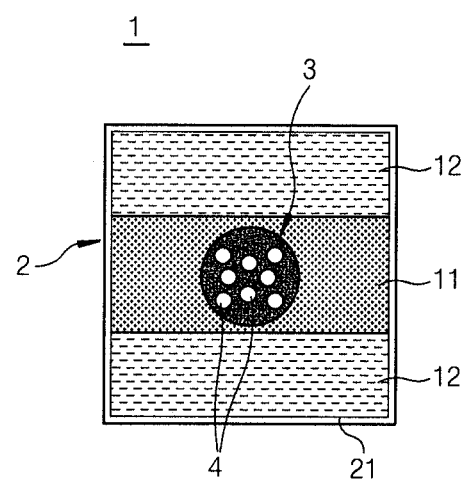

Next, evaluation on the insect attractancy of Test Examples 1 to 5 and Comparative Examples 1 and 2 for verifying the above-described various embodiments will be described. For Test Examples 1 to 5 and Comparative Examples 1 and 2, as shown in FIGS. 11A and 11B, an illumination apparatus 1 was in the form of a horizontally attached down light and was attached to a pole 10 in the central portion of a room such that lights emitted from the LED light source 3 was horizontally directed from the opening 21 of the housing body 2. The LED light source 3 was configured to illuminate the outside through holes formed in a wooden black panel 11 which was installed on a side of the housing body 2 to which the lights are emitted in order to block the opening 21.

The opening 21 of the housing body 2 is a square shape having a size of about 500 mm×500 mm, and sticky insect trap sheets 12, each having a size of 200 mm (width)×500 mm (length), were respectively attached to the top and bottom sides of the black panel 11. The lights emitted from the LED light source 3 were transmitted to the outside only through the opening 21 between the upper and lower sticky insect trap sheets 12. Here, 8 LEDs 4 were used for the LED light source 3. The illumination apparatus was fastened to the pole 10 by using a down light equipment (NNN21616) (available from Panasonic Corporation).

(Measurement Method)

A spectrum lights emitted from the illumination apparatus was measured using a multi channel photo detector (for example, MCPD-3000 available from Otsuka Electronics), and peak positions of each peak wavelength and the bottom wavelength, relative energy strength, and a bottom wavelength region of about zero were measured.

(Evaluation Method)

Evaluation for insect attractancy to attract insects was performed by comparing the number of insects trapped in an hour after three kinds of 400 insects (fly, diamondback moth, etc.) were each, released in a room of 10 mm×10 mm. Here, relative comparison was made by setting the total number of insects trapped to 100 as a reference value in Comparative Example 1.

Results of evaluation made under such conditions are listed in the following Table 1. Table 1 shows Test Examples (TE) 1 to 5 and Comparative Examples (CE) 1 and 2 in its rows, and a first peak wavelength, a ratio of a relative energy strength of bottom wavelength to a relative energy strength of peak wavelength, a half width of the peak wavelength, the presence of the ultraviolet filter, emission color, insect attractancy and tone evaluation in order in its columns. The tone evaluation was made by naked eyes when lights are emitted from the illumination apparatus of the down light type to a white board. In the tone evaluation by naked eyes, "○" was marked for a case where any of white and bulb color (warm color) appears and there was no significant change in tone, whereas "X" was marked for a case where there was any significant change in tone, particularly when the tone is strongly yellowish.

In Table 1, a peak wavelength of lights emitted from the LED chip is termed a first peak wavelength, and a peak wavelength, which is obtained by converting the first peak wavelength on the longer wavelength side than the first peak wavelength, is termed a second peak wavelength. In Table 1, the bottom/peak wavelength ratio is represented by decuple of the relative energy strength ratio of the bottom wavelength to the second peak wavelength.

TABLE 1

|    |   | First peak wavelength | Bottom/peak ratio | Half width of first peak wavelength | Ultraviolet filter | Emission color | Insect Attractancy | Tone Evaluation |
|----|---|---|---|---|---|---|---|---|
| TE | 1 | 445 | 1.8  | 19 | —                                         | White      | 70  | 0 |
|    | 2 | 450 | 1.1  | 12 | —                                         | Bulb color | 55  | 0 |
|    | 3 | 445 | 0.02 | 14 | —                                         | white      | 62  | 0 |
|    | 4 | 450 | 0.01 | 12 | —                                         | Bulb color | 46  | 0 |
|    | 5 | 410 | 0.08 | 16 | Lights of 380 nm or less are cut off by filter | White  | 51  | 0 |
| CE | 1 | 445 | 0.2  | 30 | —                                         | White      | 100 | 0 |
|    | 2 | 450 | 0.12 | 30 | —                                         | Bulb color | 90  | 0 |

Test Example 1

Test Example 1 corresponds to the above-described first embodiment, in which an LED 4 is configured to emit white lights by sealing the LED chip emitting lights having the first peak wavelength of 445 nm with silicon resin mixed with silicate yellow fluorescent materials. A spectrum of lights emitted from this illumination apparatus is as shown in FIG. 3. In this spectrum, the half width of the first peak wavelength is 19 nm. In Test Example 1, the insect attractancy is 70 which is less than the reference (100) and is small enough to provide low attractancy of flying insects. In addition, in the tone evaluation, the tone is not so strongly yellowish and there is no significant change in tone.

Test Example 2

Test Example 2 corresponds to the modification of the above-described first embodiment, in which an LED 4 used in an illumination apparatus of Test Example 2 is configured to emit bulb color lights by sealing the LED chip emitting lights having the first peak wavelength of 450 nm with silicon resin mixed with two kinds of YAG and silicate yellow fluorescent materials. A spectrum of lights emitted from this illumination apparatus is as shown in FIG. 4. In this spectrum, the half width of the first peak wavelength is 12 nm. In Test Example 2, the insect attractancy is 55 which is less than the reference (100) and is small enough to provide low attractancy of flying insects. In addition, in the tone evaluation, the tone is not so strongly yellowish and there is no significant change in tone.

Test Example 3

Test Example 3 corresponds to the above-described second embodiment, in which an LED 4 used in an illumination apparatus of Test Example 3 is formed by adding the wavelength cutoff filter 5 including the optical multi-layered film 52 to the LED 4 of Test Example 1. A spectrum of lights emitted from this illumination apparatus is as shown in FIG. 7. In this spectrum, the half width of the first peak wavelength is 14 nm, and the ratio of the bottom wavelength to the first peak wavelength is 0.02. In Test Example 3, the insect attractancy is 62 which is less than the reference (100) and is small enough to provide lower attractancy of flying insects than in Test Example 1. In addition, in the tone evaluation, the tone is not so strongly yellowish and there is no significant change in tone.

Test Example 4

Test Example 4 corresponds to the modification of the above-described second embodiment, in which an LED 4 used in an illumination apparatus of Test Example 4 is formed by adding the wavelength cutoff filter 5 including the optical multi-layered film 52 to the LED 4 of Test Example 2. A spectrum of lights emitted from this illumination apparatus is as shown in FIG. 8. In this spectrum, the half width of the first peak wavelength is 12 nm, and the ratio of the bottom wavelength to the first peak wavelength is 0.01. In Test Example 4, the insect attractancy is 46 which is less than the reference (100) and is small enough to provide lower attractancy of flying insects than in Test Example 2. In addition, in the tone evaluation, the tone is not so strongly yellowish and there is no significant change in tone.

Test Example 5

Test Example 5 corresponds to the above-described third embodiment, in which an LED 4 used in an illumination apparatus of Test Example 5 is configured to emit white lights by sealing the LED chip emitting lights having the first peak wavelength of 410 nm with silicon resin mixed with silicate yellow fluorescent materials and is provided with an ultraviolet filter 6. The ultraviolet filter 6 is formed by adding an ultraviolet absorbent (for example, Tinuvin 326 or Tinuvin 107 (available from Ciba Company) in an acryl resin and is configured to cut off lights of a wavelength of 380 nm or less (in this example, from 300 nm to 380 nm). A spectrum of lights emitted from this illumination apparatus is as shown in FIG. 7.

In this spectrum, the half width of the first peak wavelength is 16 nm, and the ratio of the bottom wavelength to the first peak wavelength is 0.08. In Test Example 5, the insect attractancy is 51 which is less than the reference (100) and is small enough to provide lower attractancy of flying insects than in Test Example 1. In addition, in the tone evaluation, the tone is not so strongly yellowish and there is no significant change in tone.

Comparative Example 1

Figure 12:
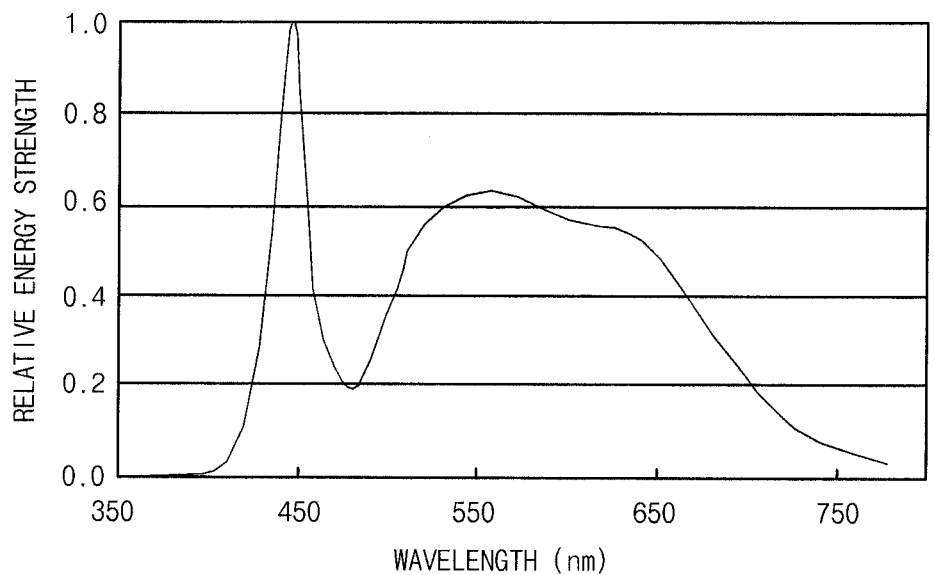
FIG. 12 shows a spectrum of lights emitted from an illumination apparatus of Comparative Example 1.

Comparative Example 1 was made by changing the peak wavelength of the LED chip and the mixture ratio of the fluorescent materials of Test Example 1. A spectrum of lights emitted from an illumination apparatus of Comparative Example 1 is shown in FIG. 12. This spectrum is characterized in that the relative energy strength of the first peak wavelength is higher than that of the second peak wavelength, as shown in FIG. 12.

The half width of the first peak wavelength is set to be equal to or more than 20 nm (30 nm in this example) and, between the first peak wavelength and the second peak wavelength, there exists no bottom wavelength to provide the relative energy strength which is ¹/₁₀ or less of that of the first peak wavelength. The ratio of the bottom wavelength to the first peak wavelength is 0.2. Comparative Example 1 where the number of trapped insects is defined by 100 has higher insect attractancy than Test Examples 1, 3 and 5. This number, i.e., 100, is assumed as the reference insect attractancy.

Comparative Example 2

Figure 13:
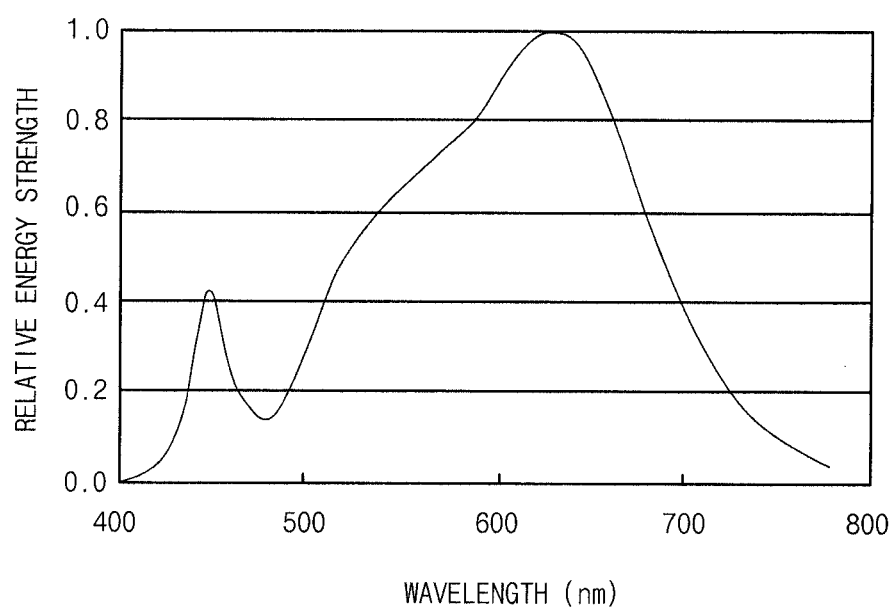
FIG. 13 shows a spectrum of lights emitted from an illumination apparatus of Comparative Example 2.
Figure 14:
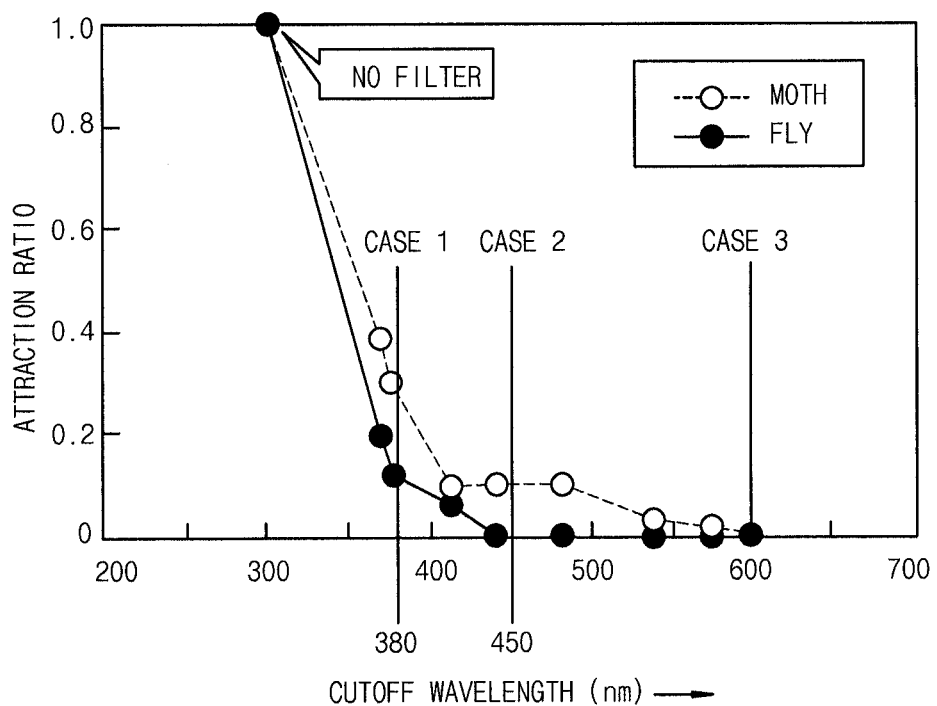
FIG. 14 shows a correlation between a light-source cutoff wavelength and an insect attraction ratio.

Comparative Example 2 was made by changing the peak wavelength of the LED chip and the fluorescent materials of Test Example 2. A spectrum of lights emitted from an illumination apparatus of Comparative Example 2 is shown in FIG. 13. This spectrum is characterized in that the relative energy strength of the second peak wavelength is higher than that of the first peak wavelength, as shown in FIG. 13. The half width of the first peak wavelength is set to be equal to or more than 20 (30 in this example) and, between the first peak wavelength and the second peak wavelength, there exists no bottom wavelength to provide the relative energy strength which is 1/10 or less of that of the first peak wavelength. The ratio of the bottom wavelength to the first peak wavelength is 0.12. Comparative Example 2 has higher insect attractancy than Test Examples 2 and 4.

As apparent from the above evaluation results, Test Examples 1 to 5 where the half width of the first peak wavelength is set to be equal to or less than 20 nm can obtain the insect attractancy of less than the reference (100). In addition, Test Examples 3 to 5 where there exists, between the first peak wavelength and the second peak wavelength, the bottom wavelength to provide the relative energy strength ratio of the bottom wavelength to the second peak wavelength, which is equal to or less than 1/10, provide low insect attractancy as well.

While the invention has been shown and described with respect to the embodiments, it will be understood by those skilled in the art that various changes and modifications may be made without departing from the spirit and scope of the invention as defined in the following claims. For example, in the LED 4 of each of the above-described embodiments, the wavelength cutoff filter, the fluorescent materials and the seal member may be integrated.

Further, instead of being filled in the frame, the seal member may be of a cap type to cover the LED chip, as well as of a shell type, a semi-sphere or the like, as long as it can provide a condensing lens function. In addition, the seal member may be formed to cover the LED chip by stacking two or more resin layers having different fluorescent materials. Moreover, the illumination apparatus of each of the embodiments is not limited to the down light but may be employed for exterior lighting fixtures such as street lamps, base light type lighting setup, and any suitable lighting instruments employing LED light sources.

What is claimed is:

1. An illumination apparatus comprising:
    an LED light source including one or more LEDs, each LED including a wavelength cutoff filter to suppress transmission of lights having at least a wave-length range of 480 nm to 490 nm,
    wherein a spectrum of lights emitted from the LED light source has a first peak wavelength in a wavelength band ranging from 380 nm to 470 nm and a second peak wavelength in a wavelength band ranging from 500 nm to 700 nm, and
    a half width of the first peak wavelength is set to be equal to or less than 20 nm.

2. The illumination apparatus of claim 1, wherein the spectrum includes a bottom wavelength lying between the first peak wavelength and the second peak wavelength, and
    a ratio of an energy strength of the bottom wavelength to a larger energy strength of the first and second peak wavelengths is equal to or less than 1/10.

3. The illumination apparatus of claim 1, wherein, in the spectrum, the energy strength of the first peak wavelength is greater than that of the second peak wavelength.

4. The illumination apparatus of claim 2, wherein, in the spectrum, the energy strength of the first peak wavelength is greater than that of the second peak wavelength.

5. The illumination apparatus of claim 1, wherein, in the spectrum, the energy strength of the second peak wavelength is greater than that of the first peak wavelength.

6. The illumination apparatus of claim 2, wherein, in the spectrum, the energy strength of the second peak wavelength is greater than that of the first peak wavelength.

7. The illumination apparatus of claim 1, wherein, in the spectrum, the energy strength in a wavelength band ranging from 380 nm or less is substantially zero.

8. The illumination apparatus of claim 2, wherein, in the spectrum, the energy strength in a wavelength band ranging from 380 nm or less is substantially zero.

9. The illumination apparatus of claim 3, wherein, in the spectrum, the energy strength in a wavelength band ranging from 380 nm or less is substantially zero.

10. The illumination apparatus of claim 4, wherein, in the spectrum, the energy strength in a wavelength band ranging from 380 nm or less is substantially zero.

* * * * *